(12) United States Patent
Park et al.

(10) Patent No.: US 12,313,979 B2
(45) Date of Patent: May 27, 2025

(54) CORRECTING APPARATUS OF EXTREME ULTRAVIOLET (EUV) PHOTOMASK AND CORRECTING METHOD OF EUV PHOTOMASK

(71) Applicant: Samsung Electronics Co., Ltd., Suwon-si (KR)

(72) Inventors: Sanguk Park, Hanam-si (KR); Yongwoo Kim, Suwon-si (KR); Jongju Park, Hwaseong-si (KR); Youngchang Seo, Hwaseong-si (KR); Jongkeun Oh, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 886 days.

(21) Appl. No.: 17/508,144

(22) Filed: Oct. 22, 2021

(65) Prior Publication Data

US 2022/0283512 A1    Sep. 8, 2022

(30) Foreign Application Priority Data

Mar. 5, 2021    (KR) .................. 10-2021-0029536

(51) Int. Cl.
| | | |
|---|---|---|
| *G03F 7/20* | (2006.01) | |
| *G02B 26/10* | (2006.01) | |
| *G03F 1/80* | (2012.01) | |
| *G03F 7/00* | (2006.01) | |

(52) U.S. Cl.
CPC ....... *G03F 7/70558* (2013.01); *G02B 26/105* (2013.01); *G03F 1/80* (2013.01); *G03F 7/70033* (2013.01); *G03F 7/70625* (2013.01)

(58) Field of Classification Search
CPC ..... G02B 26/105; G03F 1/80; G03F 7/70558; G03F 7/70033; G03F 7/70625
See application file for complete search history.

(56) References Cited

U.S. PATENT DOCUMENTS

| | | |
|---|---|---|
| 7,247,412 B2 | 7/2007 | Lee |
| 8,673,521 B2 | 3/2014 | Choi |
| 8,832,607 B2 | 9/2014 | Koike et al. |
| 9,146,459 B2 | 9/2015 | Lu et al. |
| 10,095,101 B2 | 10/2018 | Oshemkov et al. |

(Continued)

FOREIGN PATENT DOCUMENTS

| | | |
|---|---|---|
| KR | 10-1057190 B1 | 8/2011 |
| KR | 10-2022-0049651 A | 4/2022 |

*Primary Examiner* — Walter H Swanson
(74) *Attorney, Agent, or Firm* — Wolf, Greenfield & Sacks, P.C.

(57) ABSTRACT

A correcting apparatus of an extreme ultraviolet (EUV) photomask includes: a support portion configured to support an EUV photomask having a main area in which a plurality of pattern elements are arranged, a chemical supply unit configured to supply a chemical to the main area, a light source unit configured to generate a laser beam, and a control unit configured to irradiate the laser beam to the chemical supplied to the main area of the EUV photomask and to, based a laser dosage map for correcting critical dimensions (CDs) of the plurality of pattern elements in the main area, adjust a dosage of the laser beam based on the laser dosage map such that among the plurality of pattern elements, pattern elements having different critical dimensions are etched at different etching rates.

20 Claims, 17 Drawing Sheets

(56) References Cited

U.S. PATENT DOCUMENTS

| | | |
|---|---|---|
| 2015/0348852 A1 | 12/2015 | Pilch |
| 2016/0370697 A1* | 12/2016 | Oshemkov ................ G03F 1/24 |
| 2022/0113619 A1 | 4/2022 | Oh et al. |

* cited by examiner

CORRECTING APPARATUS OF EXTREME ULTRAVIOLET (EUV) PHOTOMASK AND CORRECTING METHOD OF EUV PHOTOMASK

CROSS-REFERENCE TO RELATED APPLICATION(S)

This application claims benefit of priority to Korean Patent Application No. 10-2021-0029536 filed on Mar. 5, 2021 in the Korean Intellectual Property Office, the disclosure of which is incorporated herein by reference in its entirety.

BACKGROUND

Some example embodiments relate to a correcting apparatus of an extreme ultraviolet (EUV) photomask and a correcting method of an EUV photomask.

Recently, extreme ultraviolet (EUV) photolithography, using EUV as a light source, has been proposed as a technology to form circuit patterns of a semiconductor device. Since such EUV is absorbed by most refractive optical materials, a general EUV photolithography process has used a photomask for EUV employing a reflective optical system, rather than a refractive optical system.

SUMMARY

Example embodiments provide a correcting apparatus of an extreme ultraviolet (EUV) photomask and a correcting method of an EUV photomask, which may improve critical dimension uniformity (CDU) of a photomask.

According to some example embodiments, a correcting apparatus of an extreme ultraviolet (EUV) photomask may include: a support portion configured to support an EUV photomask having a main area including a plurality of pattern elements; a chemical supply unit configured to supply a chemical to the main area; a light source unit configured to generate a laser beam; and a control unit configured to irradiate the laser beam to the chemical supplied to the main area of the EUV photomask and to, based on a laser dosage map, adjust a dosage of the laser beam such that, among the plurality of pattern elements, pattern elements having different critical dimensions are etched at different etching rates.

According to some example embodiments, a correcting apparatus of an extreme ultraviolet (EUV) photomask may include: a support portion supporting configured to support an EUV photomask having a main area including a plurality of pattern elements; a light source unit disposed on the support portion and configured to generate a laser beam irradiated to the main area in a state in which a chemical is supplied to the main area of the EUV photomask; and a control unit configured to, based on a laser dosage map, irradiate the laser beam to an entire surface of the main area on which a chemical is supplied based on a laser dosage map for the entire surface and to adjust a dosage of the laser beam such that the plurality of pattern elements are etched at different etching rates.

According to some example embodiments, a correcting apparatus of an extreme ultraviolet (EUV) photomask may include: a support portion supporting configured to support an EUV photomask having a main area including a plurality of pattern elements; a light source unit disposed on the support portion and configured to generate a laser beam irradiated to the main area in a state in which a chemical is supplied to the main area of the EUV photomask; and a control unit configured to, based on a laser dosage map, irradiate the laser beam to an entire surface of the main area on which a chemical is supplied based on a laser dosage map for the entire surface and to adjust a dosage of the laser beam such that the plurality of pattern elements are etched at different etching rates. The EUV photomask may include a substrate, a reflective layer disposed on the substrate configured to reflect EUV light, and a light absorption layer disposed on the reflective layer, and the plurality of pattern elements are provided by etching at least a portion of the reflective layer and the light absorption layer.

According to an example embodiment, a correcting method of an extreme ultraviolet (EUV) photomask includes: preparing a photomask having a main area in which a plurality of pattern elements are disposed; creating a laser dosage map for an entire surface of the main area to correct critical dimension uniformity (CDU) of the plurality of pattern elements in the main area; applying a chemical to the plurality of pattern elements; and irradiating a laser beam to the main area in a state in which the chemical is applied, and adjusting a dosage of the laser beam based on the laser dosage map.

According to an example embodiment, a correcting method of an extreme ultraviolet (EUV) photomask includes: preparing an EUV blank mask including a substrate, a reflective layer disposed on the substrate to reflect EUV light, and a light absorption layer disposed on the reflective layer; etching the light absorption layer to provide a photomask having a main area in which a plurality of pattern elements are arranged; creating a laser dosage map for an entire surface of the main area to correct critical dimension uniformity (CDU) of the plurality of pattern elements in the main area; applying a chemical to the plurality of pattern elements; and irradiating a laser beam to the main area in a state in which the chemical is applied, and adjusting a dosage of the laser beam based on the laser dosage map.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Figure 1A:
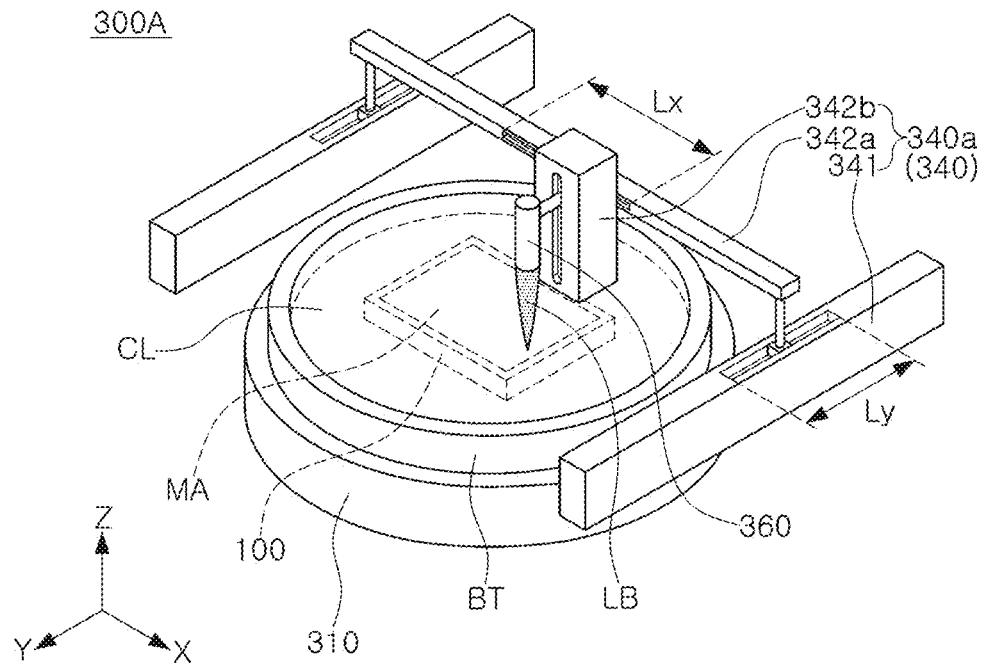
FIG. 1A is a schematic perspective view illustrating a correcting apparatus of an extreme ultraviolet (EUV) photomask according to some example embodiments.

Hereinafter, example embodiments will be described with reference to the accompanying drawings. Unless otherwise noted, like reference numerals may indicate like components. When the terms "about" or "substantially" are used in this specification in connection with a numerical value, it is intended that the associated numerical value includes a manufacturing tolerance (e.g., ±10%) around the stated numerical value.

Figure 1B:
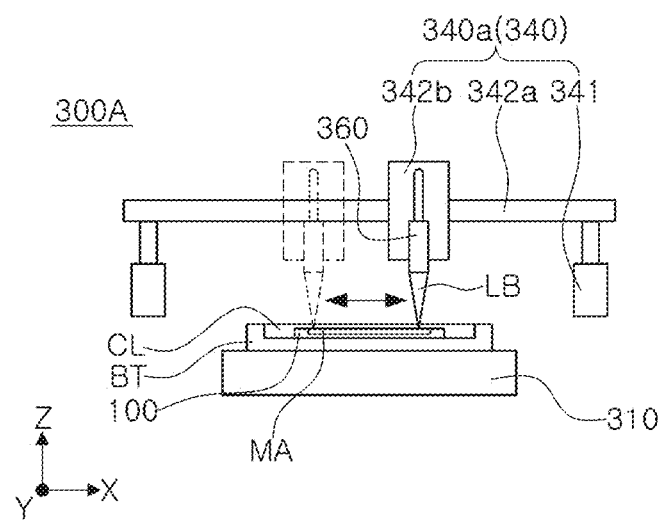
FIG. 1B is a cross-sectional view of the correcting apparatus for the EUV photomask of FIG. 1A.

FIG. 1A is a schematic perspective view illustrating a correcting apparatus 300A of an extreme ultraviolet (EUV) photomask according to some example embodiments, and FIG. 1B is a cross-sectional view of the correcting apparatus 300A for an EUV photomask of FIG. 1A.

Referring to FIGS. 1A and 1B, the correcting apparatus 300A according to some example embodiments may include a support portion 310 supporting the photomask 100, a light source unit 360 generating laser beam LB irradiated to an upper surface of the photomask 100, and a control unit 340 configured to control a dosage of the laser beam LB.

The support portion 310 may be configured to support the photomask 100 having a main area MA. The photomask 100 may include a reflective photomask for an EUV photolithography process. The main area MA may be an area in which a plurality of pattern elements are arranged, and may be formed on the upper surface of the photomask 100. In some example embodiments, the correcting apparatus 300A may further include a chemical supply unit for supplying a chemical CL to the main area MA during a correcting process of the photomask 100. In this case, the correcting apparatus 300A may further include a control unit connected to the chemical supply unit and/or the light source unit 360 to control injection of the chemical CL and irradiation of the laser beam LB. As illustrated in FIGS. 1A and 1B, the photomask 100 may be disposed in a water tank BT filled with the chemical CL. In some embodiments, the chemical CL may only be provided on a surface of the main area MA of the photomask 100. The water tank BT may provide an internal space in which cleaning and correction (etching) processes of the photomask 100 is performed using the chemical CL, and may prevent the chemical CL used in the cleaning and etching processes and materials generated during the processes from flowing to the outside. The chemical CL may be selected based on the etching and/or cleaning characteristics of the chemical compared to the photomask 100. For example, in some embodiments, the chemical CL may include at least one of aqueous ammonia ($NH_4OH$) and/or tetramethylammonium hydroxide (TMAH). The shape and/or size of the water tank BT may vary. For example, the water tank BT may be formed to have a size enough to accommodate both the photomask 100 and the support portion 310. In addition, the support portion 310 may further include an additional structure for supporting the photomask 100.

The light source unit 360 may be disposed on and/or over the support portion 310, and may be configured to generate laser beam LB irradiated to the main area MA in the state in which the chemical CL is supplied to the main area MA of the EUV photomask 100. To allow a correction region to be precisely controlled by the laser beam LB, a wavelength of the laser beam LB may be selected to be absorbed in a correction target region of the main area MA to increase a temperature of the correction target region. In some embodiments, the wavelength and/or chemical CL may be selected such that the laser beam LB passes through the chemical CL with minimal (e.g., within operational tolerances) and/or no loss. For example, the laser beam LB may have a wavelength in the range of about 200 nm to about 1100 nm and/or about 200 nm to about 700 nm, which is not absorbed by the chemical CL. The wavelength of the laser beam LB may be in the range of about 400 nm to about 600 nm such that an absorption coefficient of water with respect to the wavelength is 100 (1/m) or less, based on water accounting for a significant portion of the chemical CL. As an example, the light source unit 360 may include at least one of KrF, XeCl, ArF, KrCl, Ar, YAG, and/or $CO_2$ lasers. The light source unit 360 may include a continuous wave (CW) laser and/or a pulsed laser, for example, a femtosecond laser.

The control unit 340 may be configured to irradiate the laser beam LB to an entire surface of the main area MA in the state in which the chemical CL is supplied to the main area MA of the photomask 100. In addition, the control unit 340 may be configured to adjust a dosage of the laser beam LB depending on a position on the main area MA to which the laser beam LB is irradiated. The control unit 340 may adjust the dosage of the laser beam LB based on a laser dosage map for the main area MA. The laser dosage map will be described later in detail with reference to FIGS. 7 to 8C. The control unit 340 may adjust an increase in temperature of the chemical CL in a plurality of regions (LPnm of FIG. 11) having different critical dimensions while varying irradiation times of the laser beam LB irradiated onto the main area MA. As a result, an etching rate based on a chemical reaction may be adjusted to be different in the plurality of regions (LPnm of FIG. 11), and different deviation correction amounts may be provided such that a critical dimension of each of the plurality of regions (LPnm of FIG. 11) is proximate to a target critical dimension.

For example, when a plurality of pattern elements (PE of FIG. 6B) in the main area MA includes a first group of pattern elements (PE1 of FIG. 6B) having a first critical dimension and a second group of pattern elements (PE2 of FIG. 6B) having a second critical dimension different from the first critical dimension, the control unit 340 may adjust doses of laser beams (LB1 and LB2 of FIG. 9) irradiated to the first and second groups of pattern elements such that a first deviation correction amount (ER1 of FIG. 9) of the first critical dimension and a second deviation correction amount (ER2 of FIG. 9) of the second critical dimension are different from each other.

In the present embodiment, the control unit 340 may be configured to move the light source unit 360 in a direction, parallel to the main area MA, and to adjust a position in which the laser beam LB is irradiated on the main area MA. As an example, a control unit 340a may include a gantry 341 extending in a first direction (e.g., a Y-axis direction), a first movement portion 342a extending in a second direction (e.g., an X-axis direction) and configured to move along the gantry frame 341 in the first direction (the Y-axis direction), and a second movement portion 342b extending a third direction perpendicular to the first and second directions (e.g., a Z-axis direction), and configured to move along the first movement portion 342a in the second direction (the Y-axis direction). The light source unit 360 may be coupled to the second movement portion 342b to move in the third direction (the Z-axis direction). The control unit 340 may, for example, include pistons, gears, rails, motors, and/or actuators configured to control the movement of the light source 360. In addition, the light source unit 360 may be configured to move in the first and second directions (the X-axis and Y-axis directions) along with the first and second movement portions 342a and 342b.

The first movement portion 342a may be configured to move in at least the first direction (the Y-axis direction) of the main area MA by a first distance Ly corresponding to a width, and the second movement portion 342b may be configured to move in at least the second direction (the X-axis direction) of the main area MA by a second distance Lx corresponding to a width. Accordingly, the control unit 340a may control the light source unit 360 such that the laser beam LB emitted from the light source unit 360 can be maneuvered to cover an entire surface of the main area MA.

The control unit 340a may control the light source unit 360 in a scanning manner and/or a stepper manner. In the case of the scanning manner, the control unit 340a may adjust the dosage of the laser beam LB irradiated to the main area MA by changing a moving speed of the light source unit 360 while continuously moving the light source unit 360. In the case of the stepper manner, the control unit 340a may adjust the dosage of the laser beam LB by adjusting the number of times of processing (for example, the number of times a pulse laser is irradiated) in a specific region while discontinuously moving the light source unit 360. In some embodiments, the dosage of the laser beam LB may be independently adjusted by adjusting the intensity of the laser beam LB.

In some embodiments, the control unit 340a may include and/or be connected to processing circuitry (not illustrated) such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), and programmable logic unit, a microprocessor, application-specific integrated circuit (ASIC), etc. For example, the processing circuitry may control the operation and/or movement of the control unit 340a and/or the light source 360.

Figure 2A:
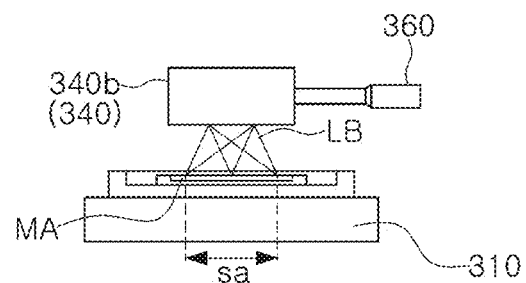
FIG. 2A is a schematic cross-sectional view of a correcting apparatus of an EUV photomask according to some example embodiments.
Figure 2B:
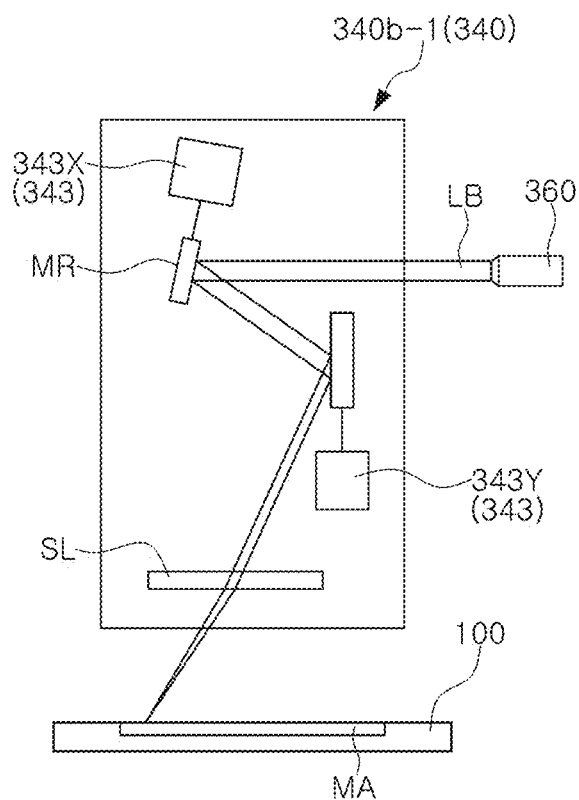
FIGS. 2B and 2C are cross-sectional views of control units adoptable for the correcting apparatus of the EUV photomask of FIG. 2A.
Figure 2C:
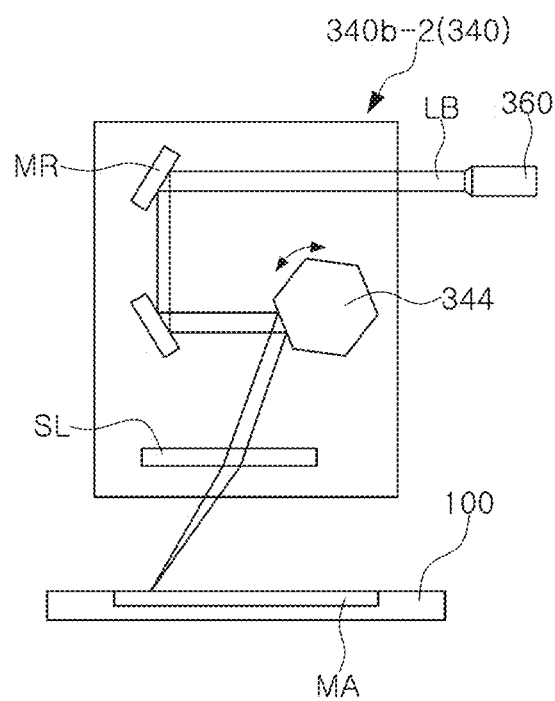

FIG. 2A is a schematic cross-sectional view of a correcting apparatus 300B of an EUV photomask according to some example embodiments, FIGS. 2B and 2C are cross-sectional views of control units 340b-1 and 340b-2 adoptable for the correcting apparatus 300B of an EUV photomask of FIG. 2A, respectively.

Referring to FIG. 2A, in the present embodiment, a control unit 340b may be configured to adjust a path of laser beam LB to change a position in which the laser beam LB is irradiated on a main area MA. The control unit 340b may adjust the path of the laser beam LB so that an irradiation area "sa" of the laser beam LB covers an entire surface of the main area MA of a photomask 100. In some embodiments, when the irradiation area "sa" of the laser beam LB does not cover the entire surface of the main area MA, the control unit 340b may be configured to directly move such that the irradiation area "sa" of the laser beam LB covers the entire surface of the main area MA. For example, the control unit 340b may be configured to be coupled to the second movement portion 243b of FIG. 1A to move in first and second directions (X-axis and Y-axis directions).

Referring to FIGS. 2B and 2C, the control unit 340b may include scanners (343 and 344 of FIGS. 2B and 2C), a mirror MR, and a scanning lens SL (for example, an F-theta lens), which are configured to adjust the path of the laser beam LB. As an example, in some embodiments, the control unit 340b-1 may include a galvano scanner 343 adjusting a pair of reflective mirrors MR to change an irradiation position of the laser beam LB. For example, the control unit 340b-1 may include a first galvano scanner 343X, changing an X-axis position of the laser beam LB, and a second galvano scanner 343Y changing a Y-axis position of the laser beam LB. As another example, in some embodiments, the control unit 340b-2 may include a polygon scanner 344 rotating a polygon mirror to change the irradiation position of the laser beam LB.

The control unit 340b may further include a diffractive optical element (DOE) splitting the laser beam LB into a plurality of laser beams. In this case, a plurality of scanners corresponding to the plurality of laser beams may be provided. As with the control unit 340a, processing circuitry may control the operation, position, and/or movement of the scanners 343 and/or 344 of the control unit 340b.

Figure 3:
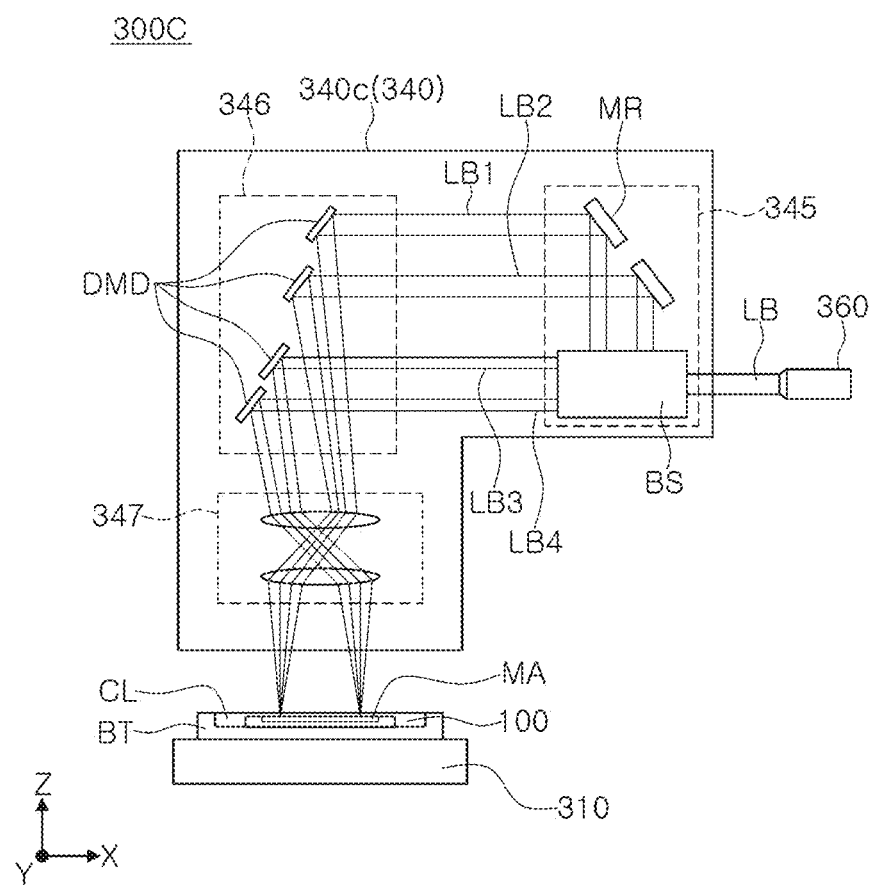
FIG. 3 is a schematic cross-sectional view of a correcting apparatus for an EUV photomask according to some example embodiments.

FIG. 3 is a schematic cross-sectional view of a correcting apparatus 300C for an EUV photomask according to some example embodiments.

Referring to FIG. 3, a control unit 340c may include a beam splitting portion 345, configured to split a laser beam LB into a plurality of laser beams (e.g., LB1, LB2, LB3, and LB4), and a light modulating portion 346 configured to irradiate the LB1, LB2, LB3, and LB4 toward an entire surface of a main area MA and/or to adjust an irradiation time of each of the plurality of laser beams LB1, LB2, LB3, LB4. Each of the plurality of laser beams LB1, LB2, LB3, and/or LB4, illustrated in the drawing, may include at least several dozen laser beams, and an irradiation area formed by the plurality of laser beams LB1, LB2, LB3, and LB4 may cover the entire main area MA. The control unit 340c may control a dose of laser beam, irradiated to each portion of the main area MA, by adjusting ON/OFF times of each of the plurality of laser beams LB1, LB2, LB3, and LB4, or condensing two or more laser beams on a single spot. The beam splitting portion 345 may include a beam splitter BS, splitting an incident laser beam LB into a plurality of laser beams LB1, LB2, LB3, and LB4 at a specified rate, and a mirror MR reflecting a plurality of laser beams toward the light modulating portion 346.

The light modulating portion 346 may include one or more micro-electro-mechanical system (MEMS) devices, respectively controlling the plurality of laser beams LB1, LB2, LB3, and LB4. The MEMS device may be, for example, a digital micromirror device (DMD) including a micromirror array. A plurality of micromirrors, included in the micromirror array, may be independently operated by a controller (not illustrated). As an example, when absence of a laser beam occurs in a single point of the main area MA due to malfunction of some micromirrors, the laser beam may be irradiated to a corresponding point using an adjacent micromirror. As with the control units 340a and 340b, processing circuitry may control the operation, position, and/or movement of the beam splitter 345 and/or the light modulation portion 346 of the control unit 340c. For example, the controller may be included in and/or include the processing circuitry.

The control unit 340c may further include a projection lens portion 347 adjusting irradiation areas of the plurality of laser beams LB1, LB2, LB3, and LB4 between the light modulating portion 346 and the photomask 100. In addition, the control unit 340c may further include a beam shaper converting a Gaussian beam shape into a flat top shape between the light source unit 360 and the beam splitting portion 345.

Figure 4:
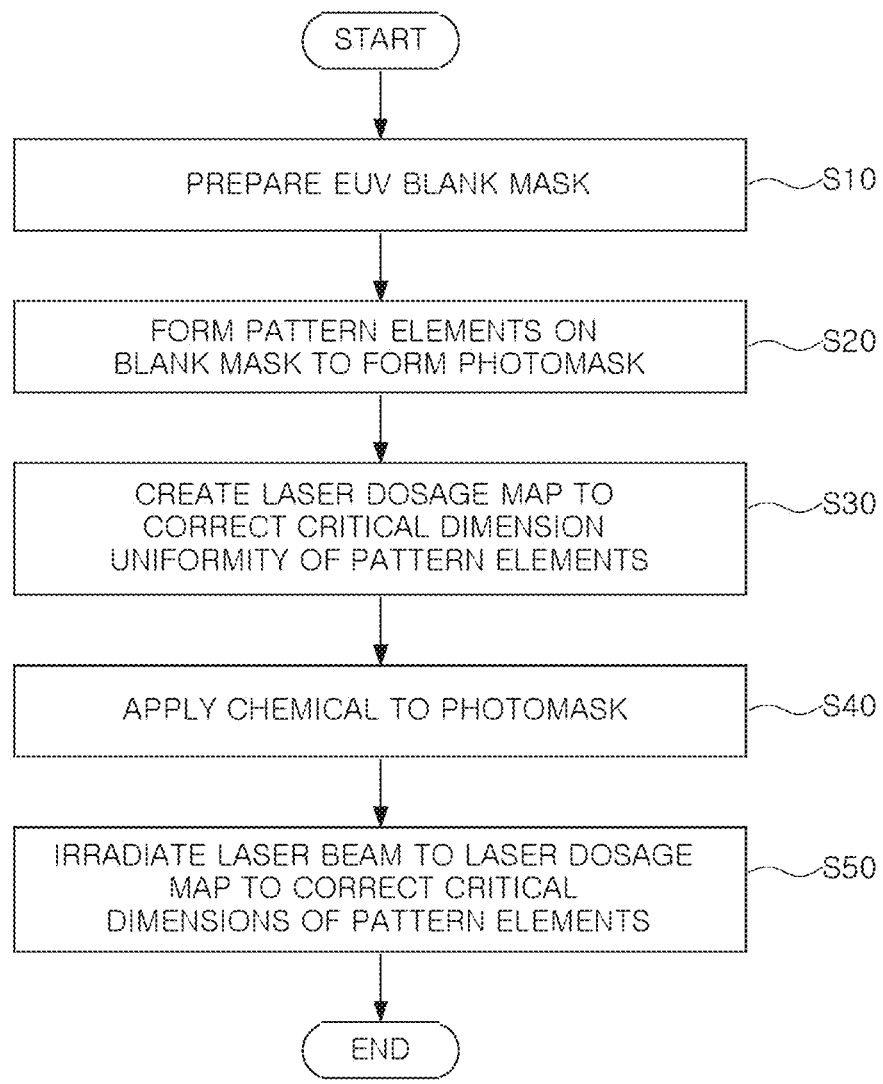
FIG. 4 is a process flowchart illustrating a method of manufacturing an EUV photomask according to some example embodiments.

FIG. 4 is a process flowchart illustrating a method of manufacturing an EUV photomask according to some example embodiments.

Referring to FIG. 4, the method of manufacturing an EUV photomask according to some example embodiments may include preparing an EUV blank mask (S10), forming a photomask in which a plurality of pattern elements are formed (S20), creating a laser dosage map (S30), applying a chemical to the photomask (S40), and irradiating a laser beam to the laser dosage map to correct critical dimensions of a plurality of pattern elements (S50). The method including the above operations may be interpreted as a method for manufacturing an EUV photomask including a correcting method of an EUV photomask. Hereinafter, each of the above operations will be described in detail with reference to FIGS. 5 to 11.

Figure 5:
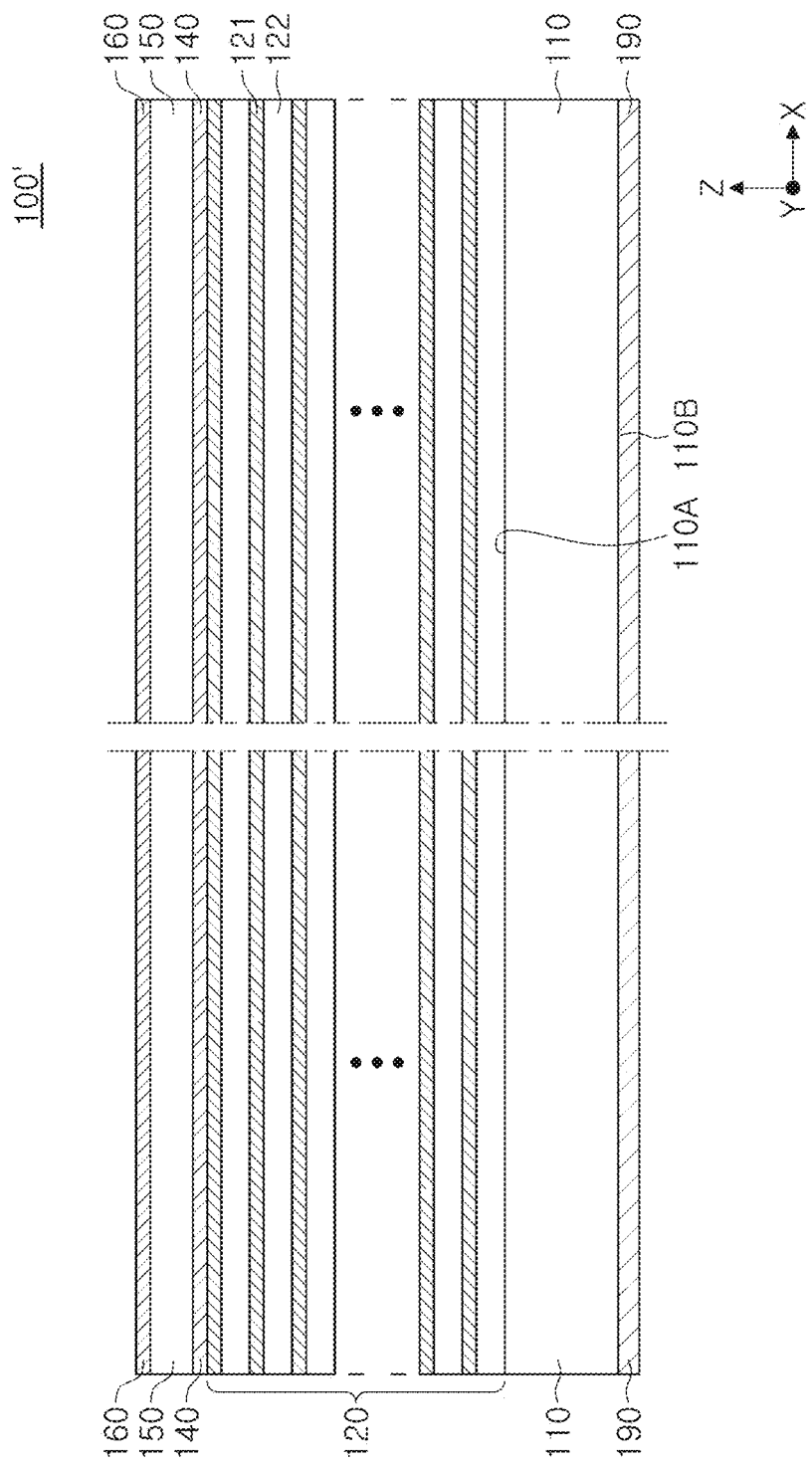
FIG. 5 is a schematic cross-sectional view illustrating an example of an EUV blank mask.

The method may start with operation S10 in which a blank mask is prepared. An example of the blank mask 100', introduced in operation S10, is illustrated in in FIG. 5. FIG. 5 is a schematic cross-sectional view illustrating an example of an EUV blank mask 100'.

Referring to FIG. 5, the blank mask 100' may include a mask substrate 110, and a reflective layer 120, a capping layer 140, and a light absorption layer 150 sequentially disposed on a first surface 110A of the mask substrate 110. The blank mask 100' may be a blank mask for a reflective photomask.

The mask substrate 110 may include a dielectric, glass, a semiconductor, or a metal material. In some embodiments, the mask substrate 110 may include a material having a low coefficient of thermal expansion. For example, a coefficient of thermal expansion of the mask substrate 110 may be about $0 \pm 1.0 \times 10^{-7} °$ C. at and/or about a temperature of 20° C. The material may be, for example, resistant to thermal expansion and/or contraction (e.g., due to changes in temperatures) even when exposed to, for example, a laser beam. The mask substrate 110 may be formed of a material having improved smoothness, flatness, and/or resistance to a cleaning solution. For example, the mask substrate 110 may include synthetic quartz glass, quartz glass, aluminosilicate glass, soda-lime glass, low thermal expansion material (LTM) glass such as $SiO_2$—$TiO_2$-based glass, crystallized glass (e.g., obtained by precipitating a beta-quartz solid solution), single-crystalline silicon, and/or a silicon carbide (SiC). The mask substrate 110 may have a first surface 110A and a second surface 110B disposed to oppose each other. In some embodiments, the first surface 110A may have a flatness of about 50 nm or less, and/or the second surface 110B may have a flatness of about 500 nm or less. In some embodiments, each of the first surface 110F and the second surface 110B of the mask substrate 110 may have a surface roughness of about 0.15 nanometers or less in a root mean square (RMS) value, but example embodiments are not limited thereto.

The reflective layer 120 may be disposed on the first surface 110A of the mask substrate 110. The reflective layer 120 may be configured to reflect light (e.g., EUV light). For example, in some embodiments, the reflective layer 120 may include a Bragg reflector in which a first material layer 121 having a high refractive index and a second material layer 122 having a low refractive index are alternately stacked a plurality of times. The first and second material layers 121 and 122 may be repeatedly formed in a period of about 20 to 60 times. For example, the reflective layer 120 may include a molybdenum (Mo)/silicon (Si) periodic multilayer, a Mo compound/Si compound periodic multilayer, a ruthenium (Ru)/Si periodic multilayer, a beryllium (Be)/Mo periodic multilayer, a Si/niobium (Nb) periodic multilayer, a Si/Mo/Ru periodic multilayer, a Si/Mo/Ru/Mo periodic multilayer, and/or a Si/Ru/Mo/Ru periodic multilayer. Materials forming the first and second material layers 121 and 122 and a thickness of each of the first and second material layers 121 and 122 may be adjusted depending on a wavelength band of applied EUV light, and/or a reflectivity of EUV light required by the reflective layer 120. In some embodiments, the reflective layer 120 for the EUV blank mask 100' may include a molybdenum (Mo) lsilicon (Si) periodic multilayer. For example, the first material layer 121 may be formed of molybdenum (or silicon), and the second material layer 122 may be formed of silicon (or molybdenum).

The reflective layer 120 may be formed using DC sputtering, RF sputtering, and/or ion beam sputtering, but example embodiments are not limited thereto. For example, when a Mo/Si periodic multilayer is formed using ion beam sputtering, a Si layer is deposited using a Si target as a target and using argon (Ar) gas as sputtering gas and a Mo layer is deposited using a Mo target as a target and using Ar gas as sputtering gas, which is set to one period herein. The Si layer and the Mo layer may be alternately formed in the period. For example, one of the Si layer or the Mo layer may be formed on the other.

The capping layer 140 may serve to protect the reflective layer from mechanical and/or chemical damages. In some embodiments, the capping layer 140 may include ruthenium (Ru) and/or a Ru compound. For example, the Ru compound may include a compound including Ru and at least one of niobium (Nb), zirconium (Zr), molybdenum (Mo), yttrium (Y), boron (B), lanthanum (La), and/or combinations thereof. In some embodiments, the capping layer 140 may have a thickness of 5 to 100 angstroms (Å).

The light absorption layer 150 may include a material having a significantly low reflectivity of EUV light while absorbing the EUV light. In addition, the light absorption layer 150 may include a material having improved chemical resistance. In some embodiments, the light absorption layer 150 may include a material having a maximum light reflectivity of about 5 or less near a wavelength of 13.5 nm when a ray of light in a wavelength area of EUV light is irradiated to a surface of the light absorption layer 150. For example, the light absorption layer 150 may include at least one of TaN, TaHf, TaHfN, TaBSi, TaBSiN, TaB, TaBN, TaSi, TaSiN, TaGe, TaGeN, TaZr, TaZrN, or combinations thereof. In some embodiments, the light absorption layer 150 may be at least one of a tantalum boron nitride (TaBN) layer or a tantalum boron oxide (TaBO) layer. In some example embodiments, a sputtering process may be used to form the light absorption layer 150, but example embodiments are not limited thereto. In some embodiments, the light absorption layer 150 may have a thickness of about 30 nm to about 200 nm.

An anti-reflective layer 160 may serve to obtain a sufficient contrast by providing a relatively low reflectivity in a wavelength band of inspection light (e.g., in a wavelength band of about 190 nm to about 260 nm) during inspection of pattern elements to be manufactured in a subsequent process. For example, the anti-reflective layer 160 may include a metal nitride (e.g., a transition metal nitride such as a titanium nitride or a tantalum nitride) and/or may additionally include at least one additional component selected from the group consisting of chlorine, fluorine, argon, hydrogen, and/or oxygen. For example, the anti-reflective layer 160 may be formed by a sputtering process, but example embodiments are not limited thereto. For example, the anti-reflective layer 160 may be formed by treating a surface of the light absorption layer 150 in an atmosphere containing an additional component or a precursor thereof. In some embodiments, the anti-reflective layer 160 may have a thickness of about 5 nm to 25 nm. A backside conductive layer 190 may be disposed on the second surface 110B of the mask substrate 110. The backside conductive layer 190 may be used to fix the mask substrate 110 to an electrostatic chuck of a lithography apparatus during a photolithography process (see FIG. 13). In some embodiments, the backside conductive layer 190 may include a Cr-containing material and/or a Ta-containing material having conductivity. For example, the backside conductive layer 190 may be formed of and/or include at least one of Cr, CrN, and/or TaB. In some embodiments, the backside conductive layer 190 may include a metal oxide and/or a metal nitride having conductivity. For example, the backside conductive layer 190 may include at least one of titanium nitride (TiN), zirconium nitride (ZrN), hafnium nitride (HfN), ruthenium oxide ($RuO_2$), zinc oxide ($ZnO_2$), and/or iridium oxide ($IrO_2$).

In other embodiments, a blank mask 100' may omit and/or additionally include some components. For example, in some embodiments the anti-reflective layer 160 and/or the capping layer 140 may be omitted. The blank mask 100' may further include a buffer layer (not illustrated) between the reflective layer 120 and the light absorption layer 150 to protect the reflective layer 120 from damage during dry etching of the light absorption layer 150 in a subsequent pattern element forming operation (S20). The buffer layer may be formed of a material having a significantly low absorption rate of EUV light.

Figure 6A:
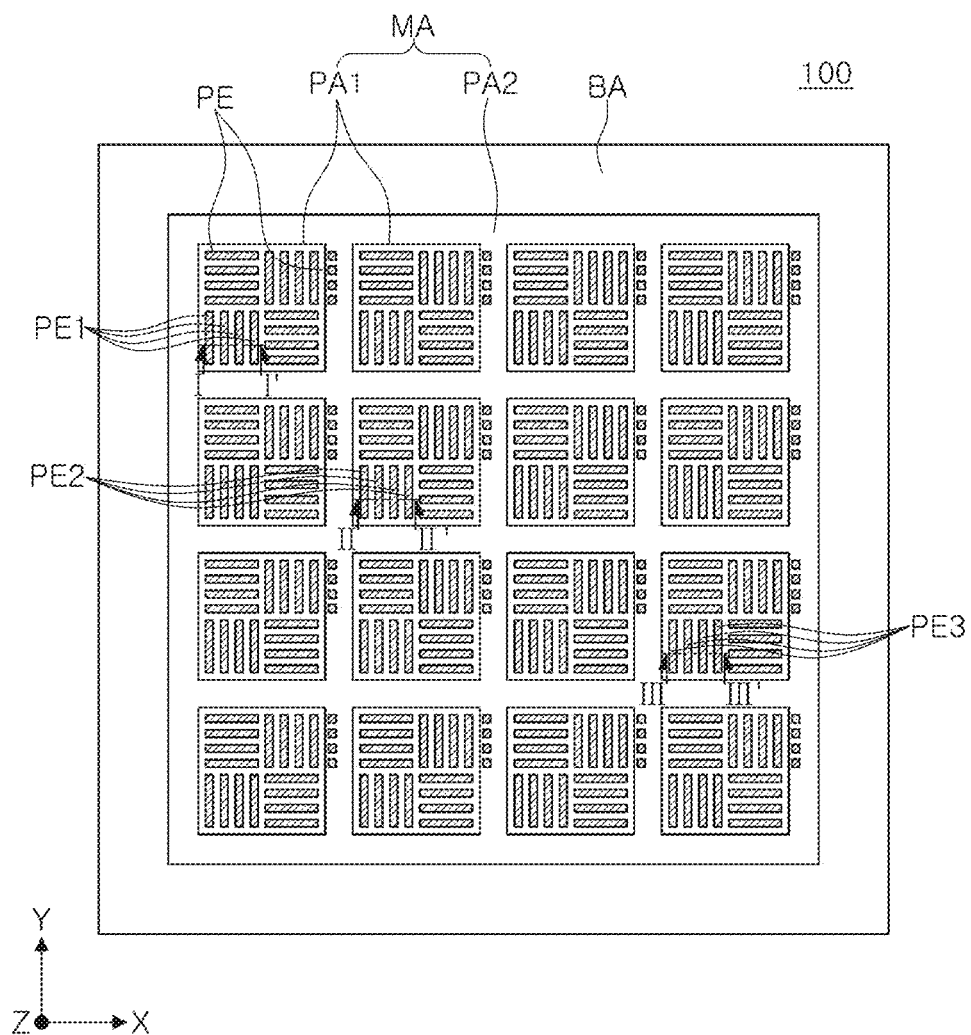
FIG. 6A is a plan view illustrating an upper surface of an EUV photomask on which a plurality of pattern elements are formed.
Figure 6B:
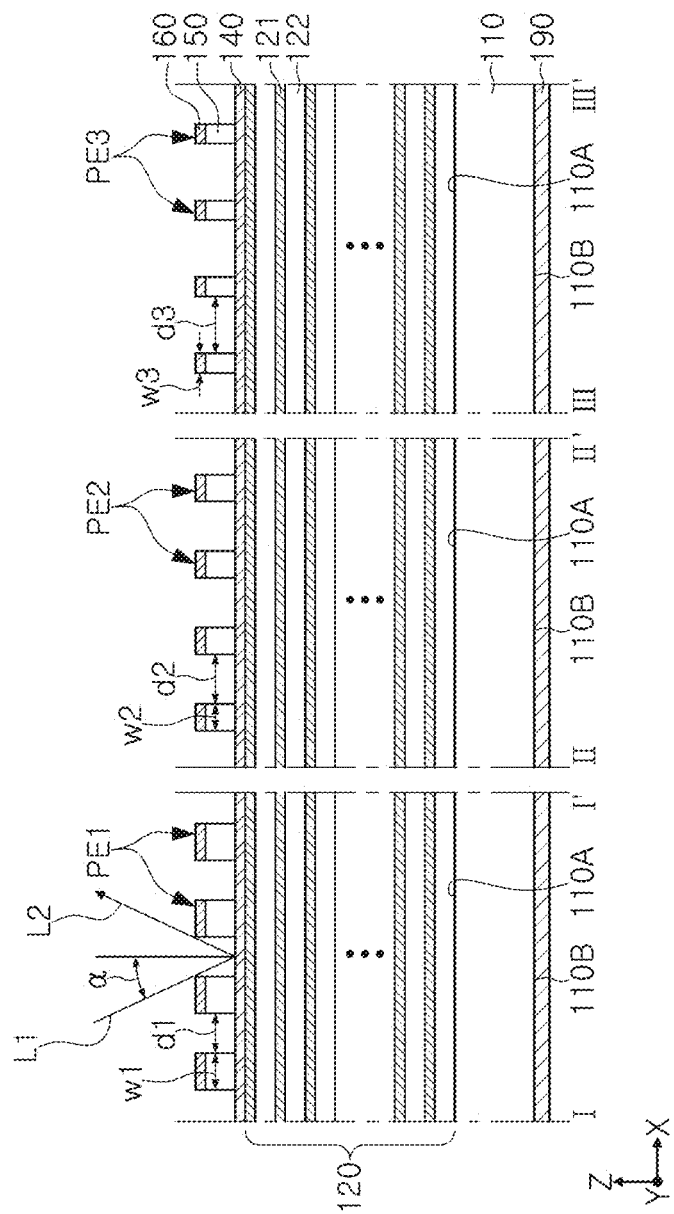
FIG. 6B illustrates cross-sectional views of an EUV photomask, respectively taken along lines I-I', II-II', and III-III'.

Next, the light absorption layer 150 may be etched to form an EUV photomask 100 having a main area MA in which a plurality of pattern elements PE are arranged (S20). An example of the EUV photomask 100 provided in operation S20 is illustrated in FIGS. 6A and 6B. FIG. 6A is a plan view illustrating an upper surface of an EUV photomask on which a plurality of pattern elements PE are formed, and FIG. 6B illustrates cross-sectional views of the EUV photomask 100, respectively taken along lines I-I', II-II', and III-III'. In operation S20, the anti-reflective layer 160 may be etched together with the light absorption layer 150 to form a plurality of pattern elements PE.

Referring to FIGS. 6A and 6B, the photomask 100 may be divided into a main area MA and a border area BA. The main area MA may be referred to as a pattern area and/or the border area BA may be referred to as a non-pattern area. The main area MA of the photomask 100 may include a main pattern area PA1 and an auxiliary pattern area PA2. The border area BA (e.g., surrounding the main pattern area PA1 and the auxiliary pattern area PA2) may be provided as the non-pattern area.

The plurality of pattern elements PE may include main pattern elements, disposed in the main pattern area PA1, and auxiliary pattern elements disposed in the auxiliary pattern area PA2. In an EUV photolithography system (see FIG. 13), main pattern elements may be elements configured to transfer a pattern (e.g., for forming unit devices constituting an integrated circuit) in a chip region on a wafer, and auxiliary pattern elements may be elements configured to transfer an auxiliary pattern to a scribe lane region on the wafer. For example, the auxiliary pattern elements may include auxiliary pattern elements (for example, an align key pattern) which are beneficial to and/or required in a process of fabricating an integrated circuit device but have partially and/or completely removed in the final integrated circuit device. The arrangement of the main pattern area PA1, the auxiliary pattern area PA2, and the plurality of pattern elements PE illustrated in FIG. 6A is provided for ease of description and illustration, and a photomask adopted for the present invention is not limited thereto. In some embodiments, among the plurality of main pattern areas PA1, some main pattern areas PA1 may be non-pattern areas in which pattern elements PE are not formed, or some main pattern areas PA1 may include pattern elements different from those of the other main pattern areas PA1.

The plurality of pattern elements PE may be formed to have a desired (and/or otherwise determined) target critical dimension. The target critical dimension may be represented as a line width of the pattern elements PE and a distance of adjacent pattern elements. For example, critical dimension uniformity (CDU) in the photomask 100 may determine critical dimension uniformity of patterns implemented on a wafer through a photolithography process. In some example embodiments, for unit elements constituting an integrated circuit, pattern elements disposed in the main pattern area PA1 may benefit from and/or require uniformity. However, the plurality of pattern elements PE may include pattern elements having a critical dimension different from the target critical dimension according to a process set distribution. As illustrated in FIG. 6B, the plurality of pattern elements PE may include, for example, a first group of pattern elements PE1 having a first critical dimension, a second group of patterns PE2 having a second critical dimension, and a third group of pattern elements PE3 having a third critical dimension. In these cases, a line width w1 of the first group of pattern elements PE1 may be greater than the line widths w2 and w3 of the second and third groups of pattern elements PE2 and PE3, and a distance d1 between adjacent pattern elements may be smaller than distances d2 and d3 between adjacent pattern elements among the second and third groups of pattern elements PE2 and PE3. As will be described in detail later with reference to FIG. 9, a correcting method of an EUV photomask, critical dimension uniformity (CDU) of the plurality of pattern elements PE may be improved with different critical dimension correction amount for pattern elements having different critical dimensions.

Light L1 (for example, an EUV beam), incident from the EUV photolithography system (see FIG. 13), may be incident at an angle α of incidence with respect to a vertical axis (e.g., an axis perpendicular to the surface of the photomask 100). For example, in some example embodiments, the angle α of incidence may range from about 5 degrees to about 7 degrees. Reflected light L2 may be projected toward a projection optical system (see FIG. 13) to perform EUV photolithography. In some embodiments, photomask 100 may be a reflective photomask applicable to an EUV photolithography process using an EUV wavelength range (e.g., an exposure wavelength of about 13.5 nm). An EUV photolithography process using an EUV photomask corrected according to the present disclosure will be described in detail later with reference to FIG. 13.

Figure 7:
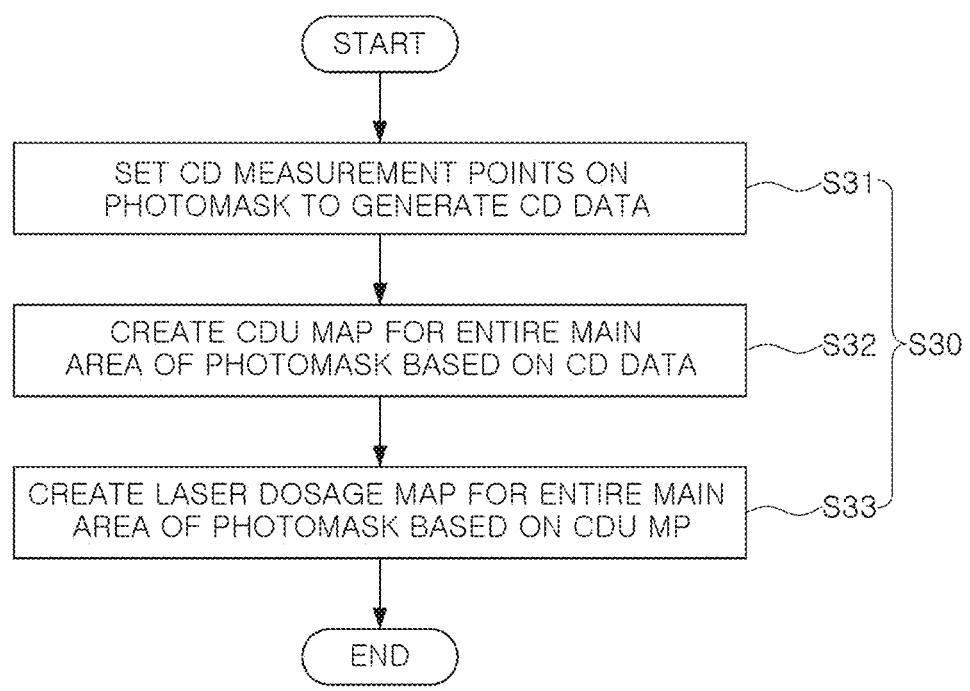
FIG. 7 is a flowchart illustrating a laser dosage map creating operation in the process flowchart of FIG. 4.

Next, a laser dosage map for an entire surface of the main area MA may be created to correct the critical dimension uniformity (CDU) of the plurality of pattern elements PE in the main area MA (S30). Detailed operations performed in operation S30 are illustrated in FIG. 7. FIG. 7 is a flowchart illustrating a laser dosage map creating operation in the process flowchart of FIG. 4.

Figure 8A:
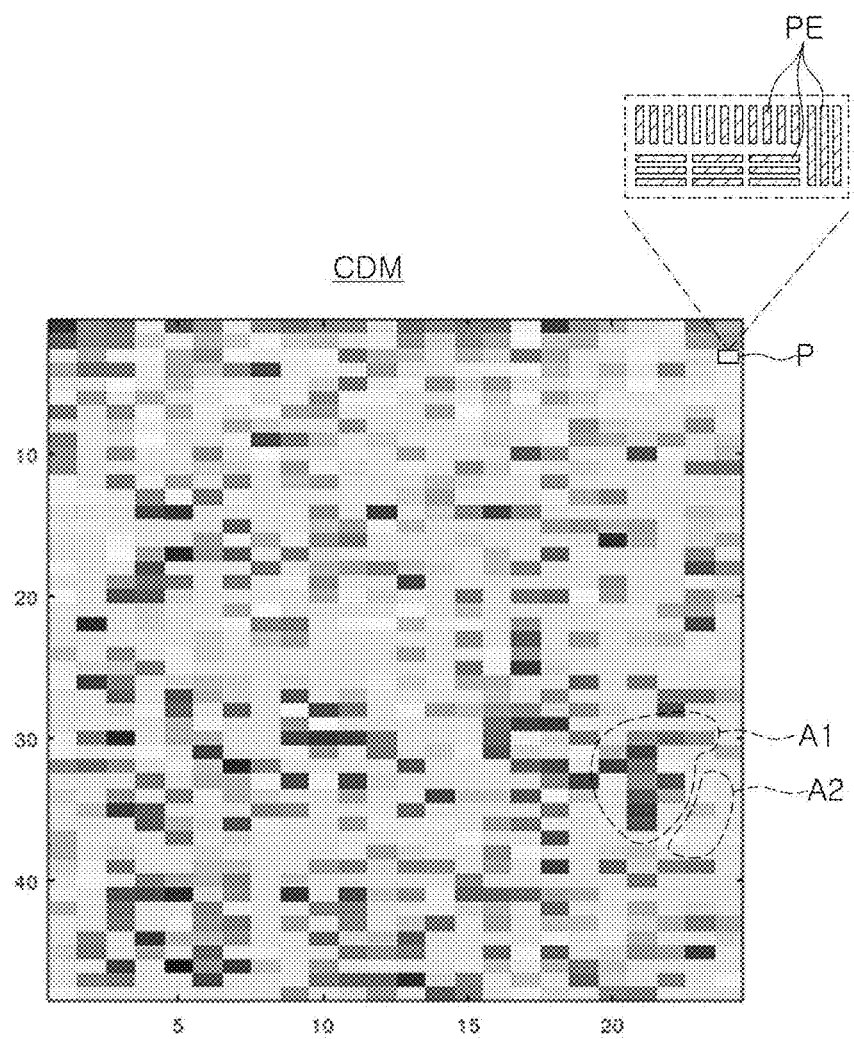
FIG. 8A is a critical dimension (CD) data map corresponding to a main area of an EUV photomask.
Figure 8B:
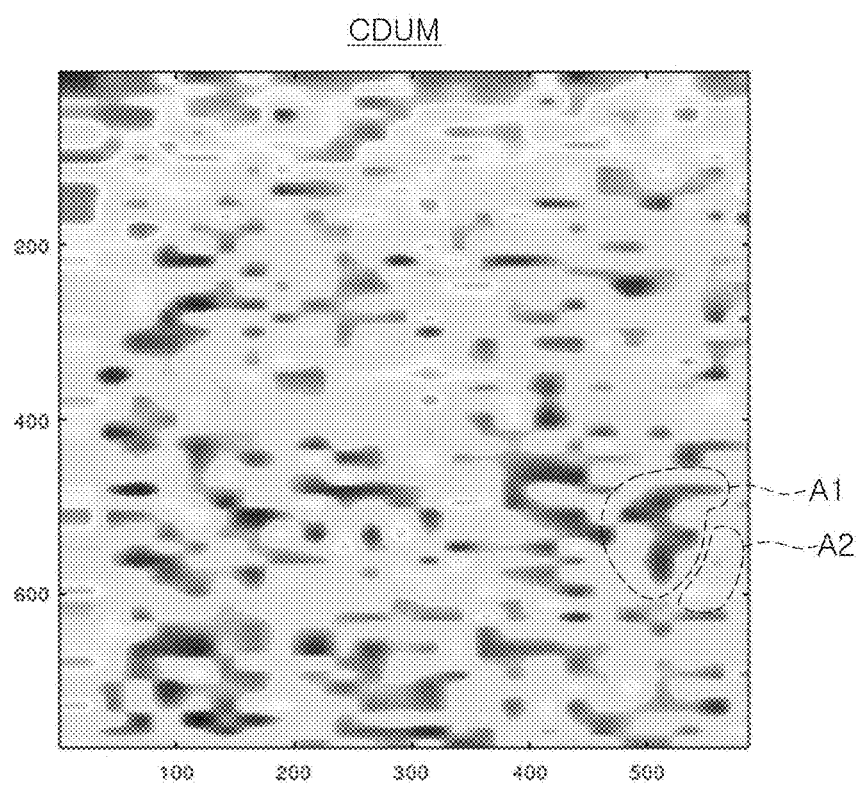
FIG. 8B is a CD uniformity map originating from the CD data map of FIG. 8A.
Figure 8C:
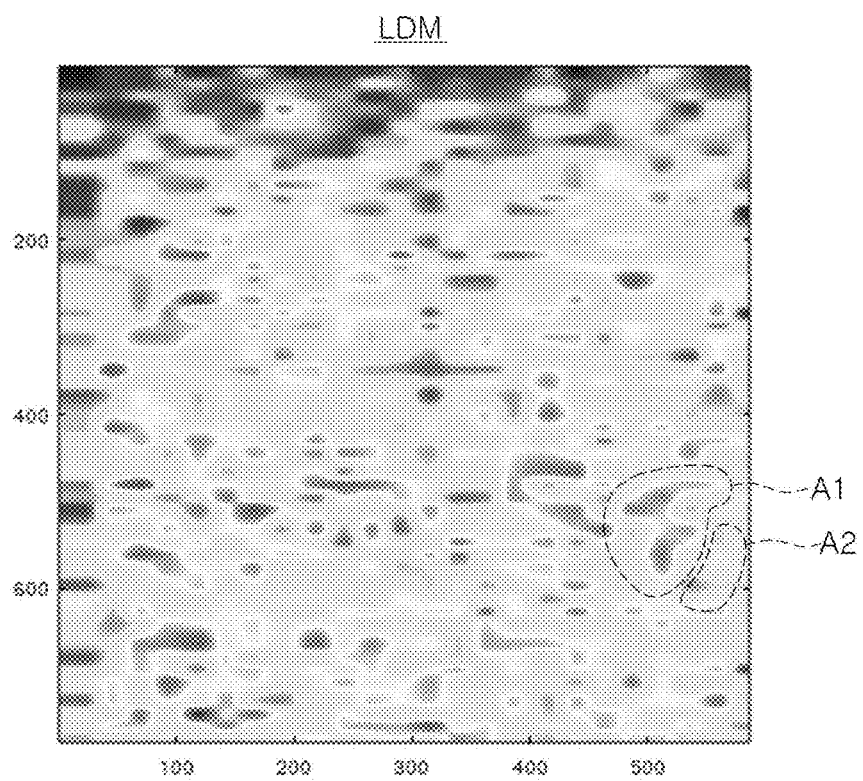
FIG. 8C is a laser dosage map originating from the CD uniformity map of FIG. 8B.

Referring to FIG. 7, the laser dosage map creating operation (S30) may include measuring critical dimensions ("CD") of pattern elements in a plurality of CD measurement points P on a photomask to generate CD data (S31), creating a CDU map for a main area of the photomask based on the CD data (S32), and creating a laser dosage map for the main area based on the CDU map (S33). For example, the CDU map and/or laser dosage map may represent the entire main area of the photomask. Examples of the CD data (or CD data map), the CDU map, and the laser dosage map (e.g., as provided in operations of FIG. 7) are illustrated in FIGS. 8A, 8B, and 8C, respectively. FIG. 8A is a critical dimension (CD) data map corresponding to a main area of an EUV photomask, FIG. 8B is a critical dimension uniformity (CDU) map originating from the CD data map of FIG. 8A, and FIG. 8C is a laser dosage map originating from the CDU map of FIG. 8B.

Referring to FIG. 8A, critical dimension (CD) data CDM may include a plurality of CD measurement points P having different critical dimensions. A plurality of pattern elements PE may be arranged on a photomask corresponding to each of the CD measurement points P, and a critical dimension in a single point P may be obtained by designating some pattern elements, among a plurality of pattern elements PE disposed in a corresponding point P, and measuring widths of the designated pattern elements and a distance between adjacent pattern elements (for example, an average value of widths of the designated pattern elements or an average value of distances therebetween). The average value of the points P may be represented in the CD data CDM may a value. As an example, in the CD data CDM, a first area A1 may have a higher level of critical dimension than a second area A2. CD measurement points included in the first area A1 are represented with relatively dark colors, and CD measurement points included in the second area A2 are represented with relatively bright colors. Since the CD data CDM is a measurement value for some pattern elements in a CD measurement point P, the CD data CDM may have discontinuous boundaries between a plurality of CD measurement points P. In some embodiments, as in the CD data CDM, illustrated in FIG. 8A, the CD data CDM may correspond to an entire main area of a photomask to be measured.

Referring to FIG. 8B, a CDU map CDUM may be obtained by converting the CD data CDM of FIG. 8A into continuous data. For example, a continuous change in critical dimension may be obtained between CD measurement points P of the CD data CDM using interpolation. As an example, the first area A1 and the second area A2 in FIG. 8B may be represented to correspond to the first area A1 and the second area A2 in FIG. 8A. As illustrated in FIG. 8B, the gradient of the critical dimension is continuously represented in the first area A1 and the second area A1. Points in which high critical dimensions are high (for example, widths of pattern elements are large and/or a distance between the pattern elements is small) are represented with relatively dark colors, and points in which critical dimensions are low (for example, widths of the pattern elements are small and/or a distance between the pattern elements is large) are represented with relatively light colors.

Referring to FIG. 8C, a laser dosage map LDM may be obtained by setting a gradient of a laser dose to correspond to the gradient of the critical dimension illustrated in the CDU map CDUM of FIG. 8B. The variation data (and/or correction amount data) of the critical dimension CD based on the laser dose may be used and/or required to create the laser dosage map LDM, which may be secured in advance through a related experiment or simulation. As an example, the first area A1 and the second area A2 are represented to correspond to FIG. 8B. A relatively high laser dose is assigned to points in which critical dimensions are low in the first area A1, and/or a relatively high laser dose is assigned to points in which critical dimensions are low in the second area A2. Accordingly, the laser dosage map LDM may include laser dose gradient information on the entire surface of the main area of the photomask.

Figure 9:
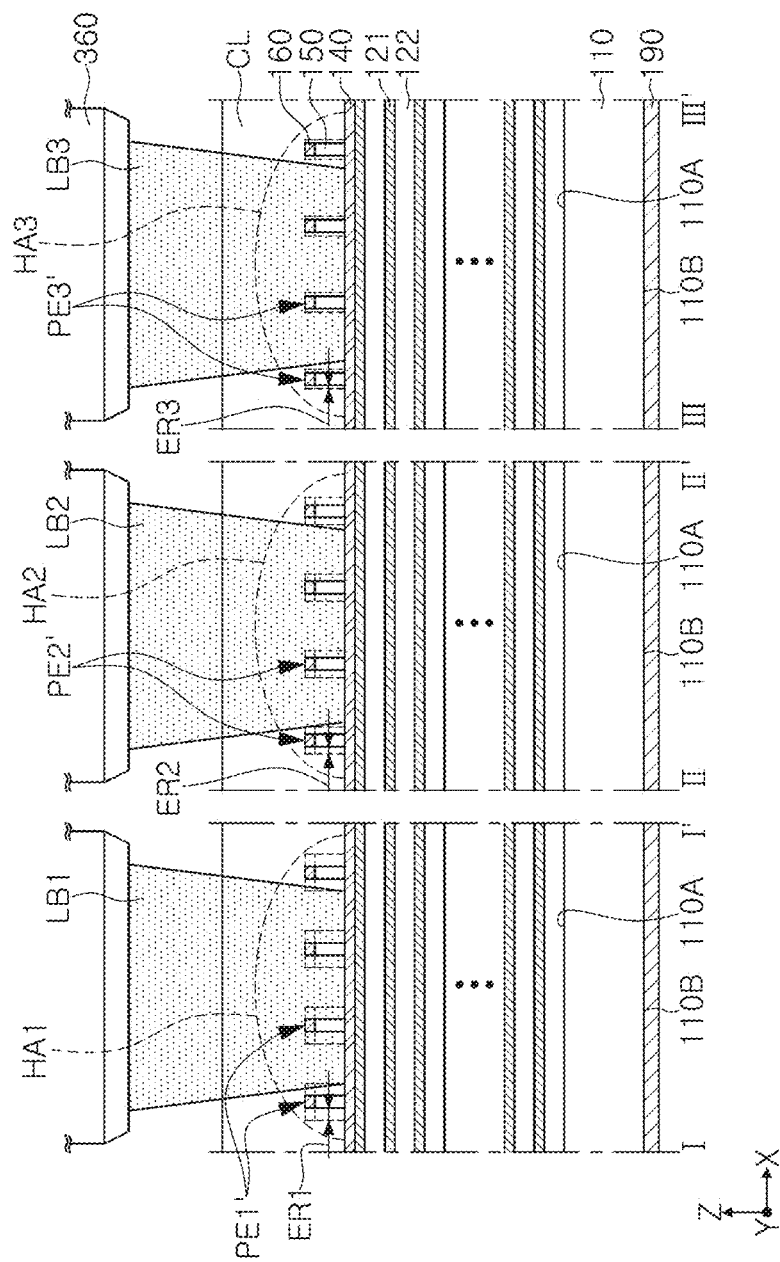
FIG. 9 is a cross-sectional view illustrating a CD uniformity correction process of an EUV photomask.

Next, a chemical CL may be applied to the photomask (S40), and laser beam may be irradiated to the main area in the state in which the chemical CL is applied, and a dosage of the laser beam may be adjusted based on the laser dosage map and critical dimensions of a plurality of pattern elements may be corrected (S50). An operation of adjusting doses of the laser beams LB1, LB2, and LB3 in a plurality of points on the main area of the photomask according to the above operations is illustrated in FIG. 9. FIG. 9 is a cross-sectional view illustrating a critical dimension uniformity correction process of an EUV photomask according to some example embodiments. FIG. 9 illustrates a critical dimension correction process for the points of FIG. 6B.

Referring to FIG. 9, in the correction of a critical dimension according to the present disclosure, a dose of laser beam irradiated to a plurality of points having different critical dimensions in the state in which the chemical CL is applied to the pattern element of the photomask, so that an increase in temperature of the chemical CL may vary in a plurality of points. As a result, various etching rates of the pattern elements may be implemented in the plurality of points. As an example, doses of first to third laser beams LB1, LB2, and LB3, irradiated to the first to third groups of pattern elements (PE1, PE2, and PE3 of FIG. 6B) may be different from each other. For example, the dose of the first laser beam LB1 may be higher than the dose of each of the second and third laser beams LB2 and LB3, and accordingly a first temperature (e.g., of a temperature increase area HAL in which a temperature is increased by the first laser beam LB1) may be higher than second and the second and third temperatures of temperature increase areas HA2 and HA3 (e.g., in which temperature are increased by the third laser beams LB2 and LB3 respectively). Accordingly, a first deviation correction amount (or an etching rate) ER1 of a first group of corrected pattern elements PE1' may be greater than a second deviation correction amount ER2 of a second group of corrected pattern elements PET and a third deviation correction amount ER3 of a third group of corrected pattern elements PE3'. The first to third laser beams LB1, LB2, and LB3 may be sequentially or simultaneously irradiated, depending on the type of a correcting apparatus of an EUV photomask according to example embodiments.

According to the above-described correcting method of an EUV photomask, a critical dimension of (e.g., an entire surface of) a photomask may be uniformly corrected by varying a critical dimension correction amount (for example, a decrease in widths of pattern elements or an increase in a distance between adjacent pattern elements) depending on a critical dimension gradient.

Figure 10:
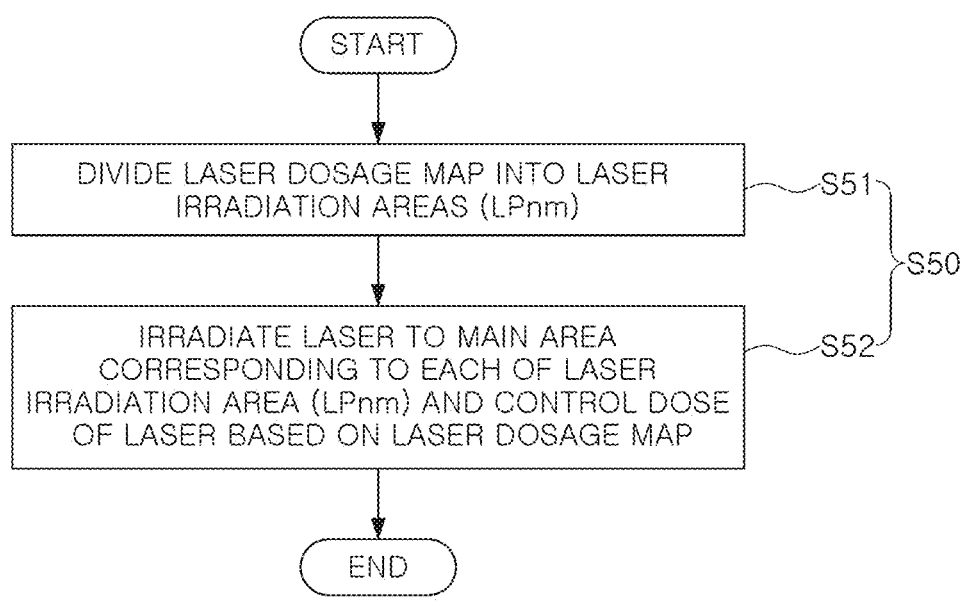
FIG. 10 is a flowchart illustrating an operation of adjusting a dose of laser beam to correct a critical dimension, in the process flowchart of FIG. 4.

Hereinafter, an example of operation S50, in which a dose of laser beam is adjusted to correct critical dimensions of a plurality of pattern element, will be described in detail with reference to FIGS. 10 and 11. FIG. 10 is a flowchart illustrating operation S50 of adjusting a dose of laser beam to correct a critical dimension, in the process flowchart of FIG. 4, and FIG. 11 illustrates a laser dosage map LDM' created by dividing the laser dosage map LDM of FIG. 8C into a plurality of laser irradiation areas LPnm.

Figure 11:
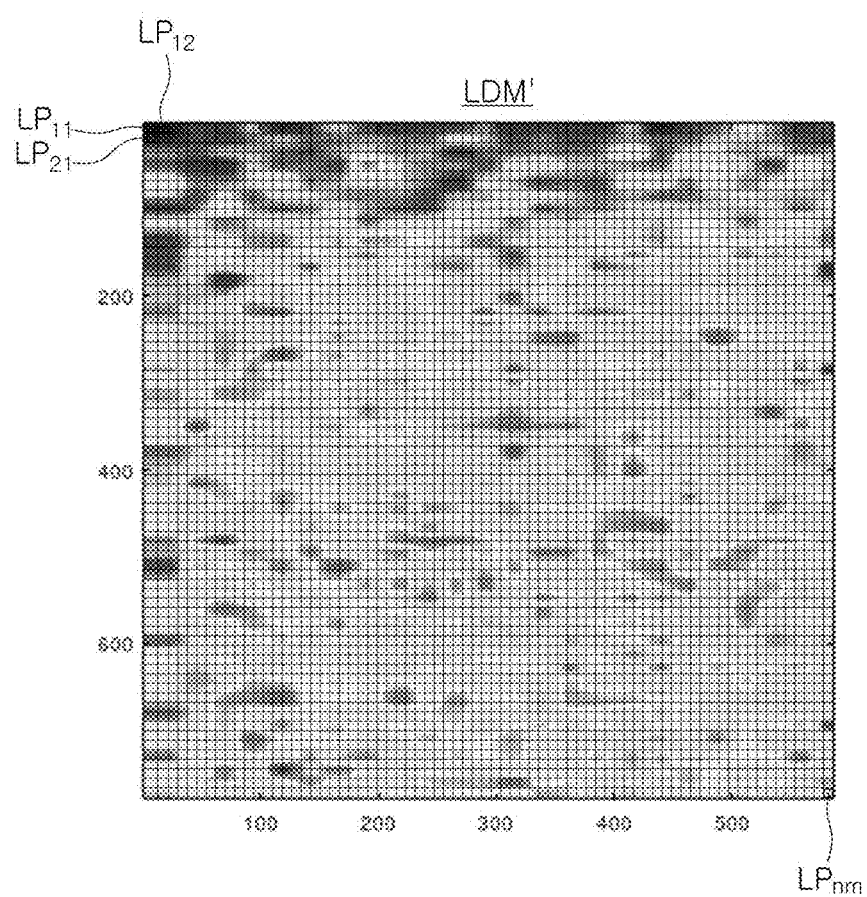
FIG. 11 illustrates a laser dosage map created by dividing the laser dosage map of FIG. 8C into a plurality of laser irradiation areas.

Referring to FIGS. 10 and 11, for example, an operation of correcting a critical dimension based on the laser dosage map LDM of FIG. 8C may be performed to adjust a dose of laser beam irradiated to each of the laser irradiation areas LPnm formed by dividing the laser dosage map LDM' (e.g., as illustrated in FIG. 11). Each of the laser irradiation areas LPnm may have an area corresponding to a spot area of irradiated laser beam. For example, when a photomask has a size of 152.4 mm×152.4 mm and a main area in the photomask has a size of 104 mm×132 mm, the main area may be divided into a plurality of laser irradiation areas LPnm constituting about a 1000-by-1000 matrix.

Figure 12A:
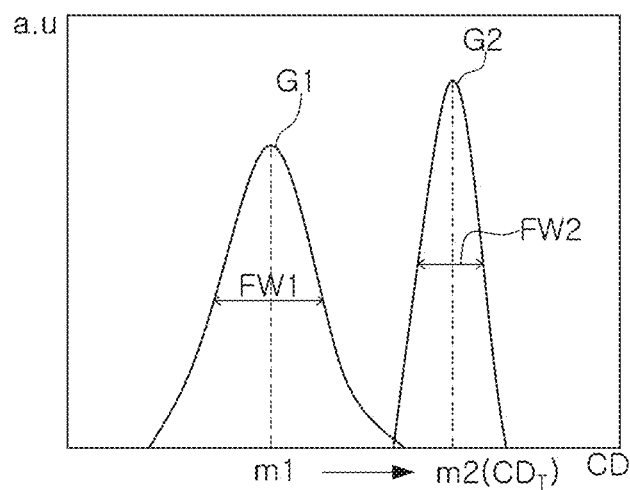
FIGS. 12A and 12B are graphs, respectively illustrating CD distributions before and after a photomask is corrected by a correcting apparatus or method of an EUV photomask according to some example embodiments.
Figure 12B:
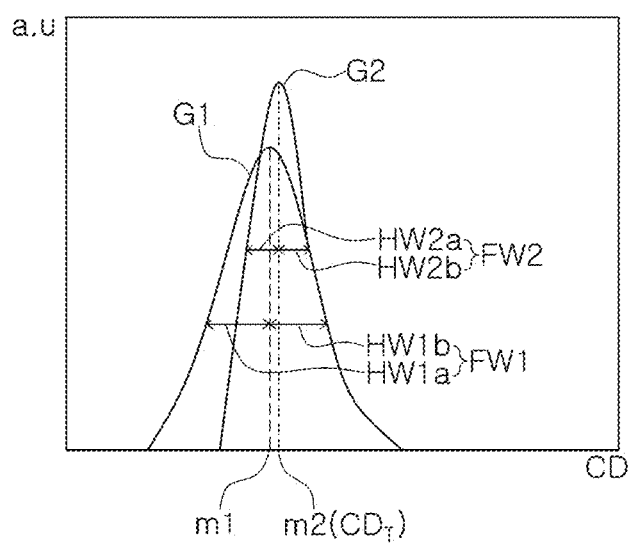

FIGS. 12A and 12B are graphs respectively illustrating CD distributions before and after a photomask is corrected by a correcting apparatus and/or method of an EUV photomask according to some example embodiments.

In the graphs of FIGS. 12A and 12B, a horizontal axis represents a critical dimension (CD) and a vertical axis represents the number (in an arbitrary unit) of CD measurement points having corresponding critical dimensions (CD) in the photomask. In addition, G1 is a first graph illustrating a critical dimension distribution in a sample photomask before CD correction, and G2 is a second graph illustrating a critical dimension distribution in the sample photomask after CD correction. The CD correction was performed in the same points as the measurement points constituting the graph G1, and thus, the G1 and G2 represent a critical dimension distribution in the same points. For ease of description, in the drawings, the critical dimension dimensions are illustrated as following a normal distribution.

Referring to FIG. 12A, when the CD of the photomask is corrected according to the correcting apparatus and/or method according to some example embodiments, a standard deviation of the second graph G2 after CD correction may be reduced, as compared with a standard deviation of the first graph G1 before CD correction. As an example, the first graph G1 before CD correction may have a first average CD(m1) and a first full width at half maximum FW1, and the second graph G2 after CD correction may have a second average CD(m2) and a second full width at half maximum FW2. The second full width at half maximum FW2 may be smaller than the first full width at half maximum FW1, and the second CD average m2 may correspond to a target critical dimension CDT.

For example, the second full width at half maximum FW2 may be about 4 nm or less based on a pattern on the photomask, and the second full width at half maximum FW2 may be about 1 nm or less based on a pattern transferred to a wafer. A position change (and/or an average CD change) from the first graph G1 to the second graph G2 means that widths of pattern elements are decreased and/or a distance between adjacent pattern elements is increased. According to the above-described correcting apparatus or method, a CD correction amount may vary (a laser dose may be adjusted) in the entire area of the photomask, and thus, the standard deviation of the second graph G2 may be significantly reduced.

Referring to FIG. 12B, similarly to FIG. 12A, a standard deviation of the second graph G2 may be reduced, as compared with a standard deviation of the first graph G1. However, CD correction amounts in some areas may be maintained to be significantly small, and thus, a second graph G2 having a horizontally asymmetrical shape may appear. For example, when the average CD(m1) of the photomask before CD correction is proximate to the target critical dimension CDT, CD correction may be intensively performed on measurement points disposed on a left side of the target critical dimension CDT. In this case, left and right widths HW1a and HW1b of the first full width at half maximum FW1 based on the first average CD(m1) may be the same, whereas a left width HW2a of the second half maximum width FW2 based on the second average CD(m2) may be smaller than a right width HW2b thereof. Alternatively, in at least a partial region of the second graph G2, a left width may be smaller than a right width based on the second average CD(m2). The second full width at half maximum FW2 may have a value similar to that of FIG. 12A. For example, the second half maximum width FW2 may be about 4 nm or less based on the pattern on the photomask, and the second half maximum width FW2 may be about 1 nm or less based on the pattern transferred to the wafer.

Figure 13:
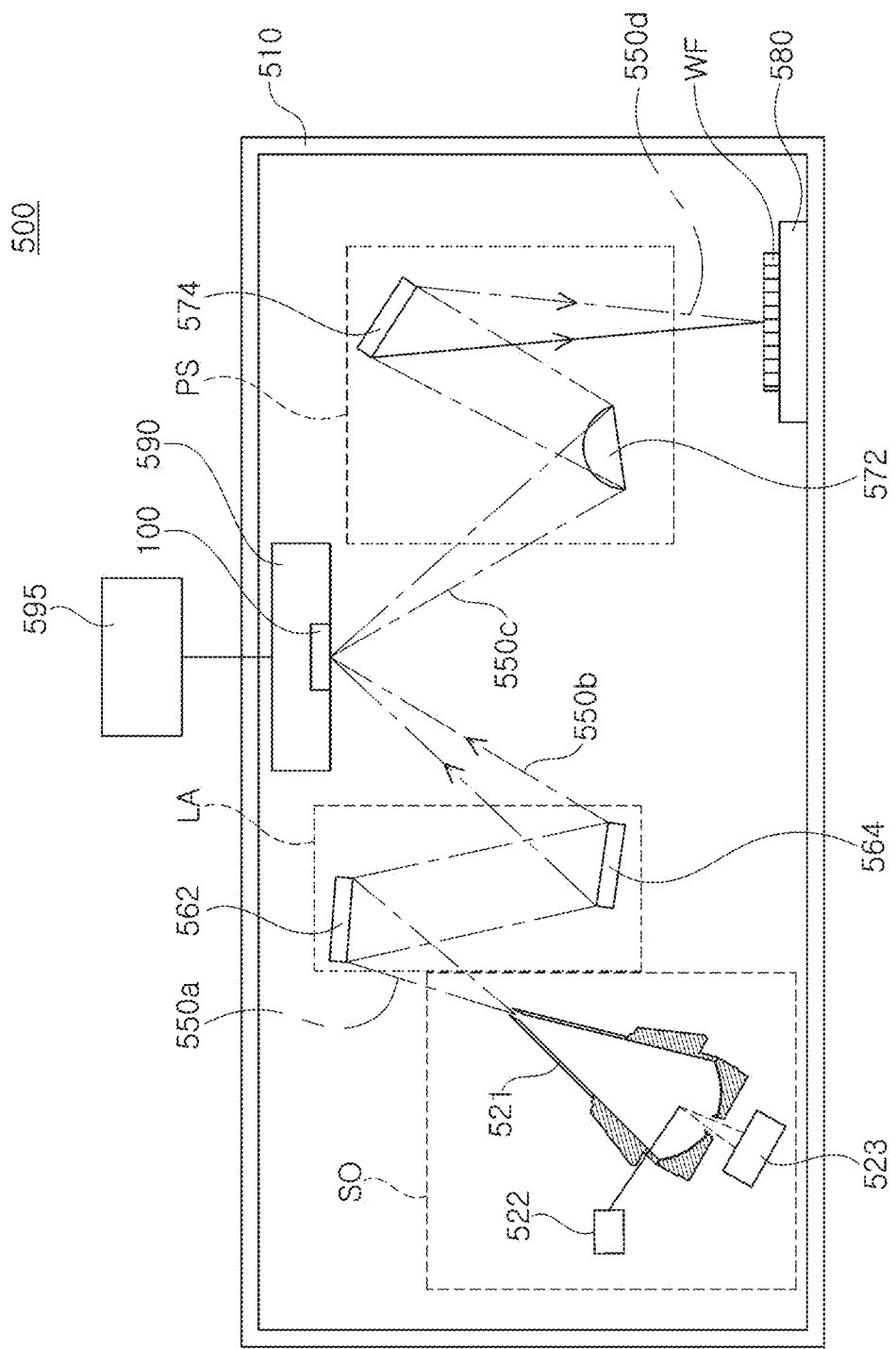
FIG. 13 is a schematic view of photolithography processing equipment for which an EUV photomask, provide by a correcting apparatus or method according to some example embodiments, is adoptable.

FIG. 13 is a schematic view of photolithography processing equipment 500 for which an EUV photomask, provided by a correcting apparatus and/or method according to some example embodiments, is adoptable.

Referring to FIG. 13, extreme ultraviolet (EUV) photolithography processing equipment 500 according to the present embodiment may include an exposure chamber 510, an EUV light source system SO, a lighting system LA, a projection system PS, a mask stage 590 on which a photomask 100 is mounted, and a wafer stage 580 on which a semiconductor wafer WF is mounted. The wafer stage 580 may move the semiconductor wafer WF to change an exposure region of a semiconductor wafer WF.

The exposure chamber 510 may have an internal space in which the EUV light source system SO, the lighting system LA, the projection system PS, the mask stage 590, and the wafer stage 580 are disposed. In some embodiments, some components may be disposed outside the exposure chamber 510. For example, a portion of the EUV light source system SO may be disposed outside the exposure chamber 510.

The mask stage 590 may be a stage to which the photomask 100 may be fixed by an electrostatic force (e.g., generated by power applied to a power supply unit 595). The semiconductor wafer WF may be loaded onto and/or unloaded from the wafer stage 580.

The internal space of the exposure chamber 510 may be in a vacuum state or a low-pressure state of about 5 Pa or less to prevent first light 550a of EUV rays generated by the EUV light source system SO from being absorbed in a gas. For example, the EUV ray may have a wavelength between about 4 nm and about 124 nm. In some embodiments, EUV ray may have a wavelength between about 4 nm and about 20 nm. As an example, EUV ray may have a wavelength of about 13.5 nm.

The EUV light source system SO may include a light source chamber 521, an EUV light source portion 523 serving as a driver light source, and a droplet supply portion 522. The EUV light source system SO may generate EUV light having a wavelength of less than about 100 nm. The EUV light source portion 523 may be, for example, a plasma source. The plasma light source may be a laser-produced plasma (LPP) light source using a $CO_2$ laser as an excitation light source to target a droplet including at least one of tin (Sn), lithium (Li), and/or xenon (Xe). In an example embodiment, the EUV light source system SO may adopt a master oscillator power amplifier (MOPA) system. For example, a pre-pulse and a main pulse may be generated using a seed laser, the pre-pulse may be irradiated to a droplet and then the main pulse may be re-irradiated to the droplet to generate plasma, and the EUV light may be emitted using the plasma.

Inside the light source chamber 521 of the EUV light source system SO, laser supplied by the EUV light source portion 523 and a droplet supplied by the droplet supply portion 522 may collide with each other more than 50,000 times per second to generate plasma. A collector of the light source chamber 521 may collect EUV light emitted from the plasma in all directions, and may concentrate the collected EUV light forwardly and then provide the concentrated EUV light to the lighting system LA.

The lighting system LA may include a plurality of mirrors to allow first light 550a of the EUV, emitted from the EUV light source system SO, to pass through the lighting system LA, and second light 550b passing through the lighting system LA may be irradiated toward a surface of the photomask of the mask stage 590. For brevity of the drawing and ease of description, only two micros 562 and 564 are illustrated as the plurality of mirrors included in the light system LA. However, example embodiments are not limited thereto, and the light system LA may include an optical system including a plurality of other mirrors.

The projection system PS may include a plurality of mirrors to allow third light 550c (e.g., light reflected from the photomask 100), to pass therethrough, and fourth light 550d passing through the projection system PS may be irradiated to a surface of the semiconductor wafer W to expose a photoresist layer. For brevity of the drawing and ease of description, only two micros 572 and 574 are illustrated as the plurality of mirrors included in the projection system PS. However, example embodiments are not limited thereto, and the projection system PS may include an optical system including a plurality of other mirrors.

As described above, a correcting apparatus of an extreme ultraviolet (EUV) photomask according to some example embodiments may include a control unit (e.g., at least one of the control units 340a, 340b, and/or 340c of FIGS. 1 to 3) configured to control a dose of laser based on a critical dimension uniformity (CDU) map. As a result, critical dimension uniformity (CDU) may be improved.

In addition, a correcting apparatus of an extreme ultraviolet (EUV) photomask according to some example embodiments may include controlling a dose of laser based on a critical dimension uniformity (CDU) map of a photomask under a wet-etching environment. As a result, critical dimension uniformity (CDU) may be improved.

While example embodiments have been shown and described above, it will be apparent to those of ordinary skill in the art that modifications and variations could be made without departing from the scope of the present inventive concept as defined by the appended claims.

What is claimed is:

1. A correcting apparatus of an extreme ultraviolet (EUV) photomask, the correcting apparatus comprising:
    a support portion configured to support an EUV photomask having a main area including a plurality of pattern elements;
    a chemical supply unit configured to supply a chemical to the main area;
    a light source unit configured to generate a laser beam; and
    a control unit configured to irradiate the laser beam to the chemical supplied to the main area of the EUV photomask and to, based on a laser dosage map, adjust a dosage of the laser beam such that, among the plurality of pattern elements, pattern elements having different critical dimensions are etched at different etching rates.

2. The correcting apparatus of claim 1, wherein
    the plurality of pattern elements include at least a first group of pattern elements and a second group of pattern elements,
    the first group of pattern elements having a first critical dimension,
    the second group of pattern elements having a second critical dimension different from the first critical dimension, and
    the control unit is configured to adjust the dosage of the laser beam such that a first deviation correction amount of the first critical dimension and a second deviation correction amount of the second critical dimension are different from each other.

3. The correcting apparatus of claim 1, wherein
    the control unit includes
        a gantry frame extending in a first direction,
        a first movement portion extending in a second direction and configured to move along the gantry frame in the first direction, and
        a second movement portion extending in a third direction perpendicular to the first and second directions, the second movement portion configured to move along the first movement portion in the second direction, and
    the light source unit is coupled to the second movement portion and configured to move in the third direction.

4. The correcting apparatus of claim 3, wherein
    the light source unit is configured to move along with the first and second movement portions in the first and second directions, and
    the control unit is configured to change a speed at which the light source unit moves in the first and second directions to adjust the dosage of the laser beam.

5. The correcting apparatus of claim 1, wherein the control unit includes a scanner configured to adjust a path of the laser beam to change a position in which the laser beam is irradiated on the main area.

6. The correcting apparatus of claim 5, wherein
    the control unit further includes a diffractive optical element (DOE) configured to split the laser beam into a plurality of laser beams, and
    wherein the scanner is configured to adjust a path of each of the plurality of laser beams to irradiate the plurality of laser beams to a plurality of positions on the main area.

7. The correcting apparatus of claim 5, wherein the scanner includes at least one of a galvano scanner and a polygon scanner.

8. The correcting apparatus of claim 1, wherein the control unit includes
    a beam splitting portion configured to split the laser beam into a plurality of laser beams, and a light modulating portion configured to irradiate the plurality of laser beams to the entire surface of the main area and to adjust an irradiation time of each of the plurality of laser beams.

9. The correcting apparatus of claim 8, wherein the light modulating portion includes a digital micromirror device (DMD).

10. The correcting apparatus of claim 1, wherein the laser beam has a wavelength not absorbed in the chemical.

11. The correcting apparatus of claim 10, wherein the wavelength ranges from about 200 nm to about 1100 nm.

12. The correcting apparatus of claim 1, wherein the light source unit includes at least one of KrF, XeCl, ArF, KrCl, Ar, YAG, or $CO_2$ lasers.

13. The correcting apparatus of claim 1, wherein the chemical includes at least one of aqueous ammonia ($NH_4OH$) and tetramethylammonium hydroxide (TMAH).

14. A correcting apparatus of an extreme ultraviolet (EUV) photomask, the correcting apparatus comprising:
   a support portion configured to support an EUV photomask having a main area including a plurality of pattern elements;
   a light source unit configured to generate a laser beam; and
   a control unit configured to, based on a laser dosage map, irradiate the laser beam to an entire surface of the main area on which a chemical is supplied and to adjust a dosage of the laser beam such that the plurality of pattern elements are etched at different etching rates.

15. The correcting apparatus of claim 14, wherein
   the plurality of pattern elements includes a first group of pattern elements having a first critical dimension and a second group of pattern elements having a second critical dimension different from the first critical dimension,
   the control unit is configured to adjust a dosage of the laser beam such that the chemical, adjacent to the first group of pattern elements, increases to a first temperature and the chemical, adjacent to the second group of pattern elements, increases to a second temperature lower than the first temperature, and
   an etching rate of the first group of pattern elements, etched by the chemical, at the first temperature is higher than an etching rate of the second group of pattern elements, etched by the chemical, at the second temperature.

16. The correcting apparatus of claim 14, wherein the chemical includes at least one of aqueous ammonia ($NH_4OH$) and tetramethylammonium hydroxide (TMAH).

17. The correcting apparatus of claim 14, wherein the laser beam has a wavelength ranging from about 200 nm to about 700 nm.

18. A correcting apparatus of an extreme ultraviolet (EUV) photomask, the correcting apparatus comprising:
   a support portion configured to support an EUV photomask having a main area including a plurality of pattern elements;
   a light source unit configured to generate a laser beam; and
   a control unit configured to, based on a laser dosage map, irradiate the laser beam to an entire surface of the main area on which a chemical is supplied and to adjust a dosage of the laser beam such that the plurality of pattern elements are etched at different etching rates,
   wherein the EUV photomask includes a substrate, a reflective layer on the substrate configured to reflect EUV light, and a light absorption layer on the reflective layer, and
   the plurality of pattern elements are provided by etching at least a portion of the reflective layer and the light absorption layer.

19. The correcting apparatus of claim 18, wherein
   the reflective layer includes a first material layer and a second material layer alternately stacked, and
   the first material layer includes silicon (Si), and the second material layer includes molybdenum (Mo).

20. The correcting apparatus of claim 18, wherein the light absorption layer includes at least one of TaN, TaHf, TaHfN, TaBSi, TaBSiN, TaB, TaBN, TaSi, TaSiN, TaGe, TaGEN, TaZr, or TaZrN.

* * * * *